United States Patent
Portisch

(10) Patent No.: US 12,085,594 B2
(45) Date of Patent: Sep. 10, 2024

(54) METHOD AND CIRCUIT ARRANGEMENT FOR ASCERTAINING A TYPE AND VALUE OF AN INPUT VOLTAGE

(71) Applicant: Siemens Aktiengesellschaft, Munich (DE)

(72) Inventor: Daniel Portisch, Poysdorf (AT)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 129 days.

(21) Appl. No.: 17/772,396

(22) PCT Filed: Oct. 23, 2020

(86) PCT No.: PCT/EP2020/079929
§ 371 (c)(1),
(2) Date: Apr. 27, 2022

(87) PCT Pub. No.: WO2021/083810
PCT Pub. Date: May 6, 2021

(65) Prior Publication Data
US 2022/0373581 A1 Nov. 24, 2022

(30) Foreign Application Priority Data
Oct. 29, 2019 (EP) .................................. 19205873

(51) Int. Cl.
*G01R 23/02* (2006.01)
*G01R 19/00* (2006.01)
(Continued)

(52) U.S. Cl.
CPC ......... *G01R 23/02* (2013.01); *G01R 19/0084* (2013.01); *H02M 1/44* (2013.01); *H02M 3/24* (2013.01)

(58) Field of Classification Search
USPC ....................................................... 324/76.39
See application file for complete search history.

(56) References Cited

U.S. PATENT DOCUMENTS

2014/0140110 A1* 5/2014 Portisch ................ H02M 5/44
363/34

FOREIGN PATENT DOCUMENTS

CN 102299617 12/2011
GB 2493450 2/2013
(Continued)

OTHER PUBLICATIONS

PCT International Search Report dated Jan. 18, 2021 based on PCT/EP2020/079929 filed Oct. 23, 2020.

Primary Examiner — Farhana A Hoque
(74) Attorney, Agent, or Firm — Cozen O'Connor

(57) ABSTRACT

Circuit arrangement via which a voltage type and value of an input voltage of a power supply or a switching-mode power supply is ascertained is configured such that the input voltage of the power supply decreases at the input side and includes a differential amplifier for converting the input voltage into a signal rectified by a first rectifier such that a forward voltage of the first rectifier is compensated, includes an inverter which generates an inverted signal rectified by a second rectifier such that a forward voltage of the second rectifier is compensated, includes a mixer via which a first output signal is generated from the useful signals, from which first output signal a second output signal is derived via a filter such that the voltage type is determinable from the first output signal, and a voltage value of the input voltage can be determined from the second output signal.

3 Claims, 5 Drawing Sheets

(51) Int. Cl.
*H02M 1/44* (2007.01)
*H02M 3/24* (2006.01)

(56) References Cited

FOREIGN PATENT DOCUMENTS

JP       H0682487       3/1994
WO    2015157857    10/2015

* cited by examiner

METHOD AND CIRCUIT ARRANGEMENT FOR ASCERTAINING A TYPE AND VALUE OF AN INPUT VOLTAGE

CROSS-REFERENCE TO RELATED APPLICATIONS

This is a U.S. national stage of application No. PCT/EP2020/079929 filed 23 Oct. 2020. Priority is claimed on European Application No. 19205873.3 filed 29 Oct. 2019, the content of which is incorporated herein by reference in its entirety.

BACKGROUND OF THE INVENTION

1. Field of the Invention

The present invention relates in general to the field of electrical engineering, in particular to the field of power electronics and power electronics circuits and, more specifically, to a method and circuit arrangement, via which an input voltage of a power supply or a switched-mode power supply is analyzed, i.e., a voltage value, in particular an average value, of the input voltage of the power supply and a respective voltage type of the input voltage are ascertained.

2. Detailed Description of the Related Art

In manufacturing and automation technology, power supplies or switched-mode power supplies are used on a large scale to supply consumers, such as electronic controllers, pumps, valves, and/or sensors. These consumers are supplied with a suitable, often predefined, voltage by the power supply or the switched-mode power supply. To this end, a high voltage level on the input side, such as a 230 V AC voltage or a 120 V AC voltage, is typically converted on an output side of the power supply to a lower and usually constant voltage level that is predefined for the consumers (for example, 24 V DC voltage as nominal output voltage and 28 V DC voltage as maximum output voltage).

The power supply or the switched-mode power supply is usually supplied with a network voltage as input voltage from a single-phase or three-phase supply network, in particular a three-phase network. A single-phase power supply can be fed, for example, with an AC voltage (for example, 230 V AC voltage) as input voltage, which usually drops as the difference between a "phase conductor" and a "neutral conductor" of the supply network. Therefore, such a power supply is often provided with an input stage, for example, in the form of a rectifier unit, via which the AC voltage from the supply network is converted into a DC voltage for the power supply. The mostly unstabilized input voltage is then converted by the power supply or the switched-mode power supply into a constant output voltage or into the predefined supply voltage for the electrical consumers, where a constancy of the output voltage and/or an output current is achieved through regulation of the flow of energy.

The constancy of the output voltage leads, for example, to an input current of the power supply beginning to increase when the input voltage decreases. This may lead, for example, to the components of the power supply or the switched-mode power supply heating up or may even lead to damage. Therefore, for safety reasons, the input voltage of the power supply is usually monitored and, if necessary, the output of the power supply is disconnected when the input voltage undershoots a predetermined value, for example. In order to prevent overheating of or damage to the power supply, especially the single-phase power supply, on account of an undervoltage on the input side or an undervoltage from the supply network, a continuous and as far as possible accurate measurement of the input voltage of the power supply is necessary, for example, via a separate measurement circuit, by which a primary-side reference potential or ground potential of the power supply is used, for example.

The input voltage can be measured, for example, via a half-wave rectification of the input voltage, in which one diode is provided for each of the phase conductor and the neutral conductor of the supply voltage, for example, and via an ohmic voltage divider. However, this measurement variant of the input voltage has the disadvantage that, for example, at no-load or at part-load a capacitive voltage divider is formed on the output side of the power supply or the switched-mode power supply by what are known as Y capacitors. The so-called Y capacitors are used for electromagnetic compatibility (EMC) to prevent undesired influencing of other devices on the AC side. The Y capacitors are installed between phase conductors and neutral conductors and protective ground conductors or protective earth (PE). The capacitive voltage divider formed by the Y capacitors, for example, influences the primary-side reference or ground potential and can cause the measurement of the input voltage, in particular of the average value or the voltage level, to become very inaccurate.

Furthermore, this measurement variant also cannot be used to determine the voltage type of the input voltage, for example. With a voltage supplied by a voltage source or a supply network, it is possible to distinguish between DC voltage and AC voltage as voltage type. A DC voltage is a voltage with an instantaneous value that hardly changes or does not change at all over a relatively long observation period. That is, the same sign and (approximately) the same magnitude at any time. A voltage with a polarity that changes at regular repetitions but has an average value over time of zero is referred to as an AC voltage.

A further variant of ascertaining the input voltage of a power supply or a switched-mode power supply can be implemented, for example, via a full-wave rectifier or bridge rectifier, which rectifies the input voltage, and with the aid of a differential amplifier, to which the rectified input voltage is fed. However, this measurement variant has the disadvantage that, in the case of a network-side overvoltage, known as a surge, the rectifier unit for measuring the input voltage must withstand the same overvoltage values as the input-side rectifier unit of the power supply. This may lead to a high degree of loading for components used for the input voltage measurement (for example, diodes of the rectifier unit, etc.) and these components having to be designed accordingly in order to be able to withstand overvoltages that may arise. Dimensioning of this kind may lead, for example, to relatively high costs and, on account of the number and size of the components required, to a relatively large space requirement.

SUMMARY OF THE INVENTION

In view of the foregoing, it is therefore an object of the invention to provide a circuit arrangement and an associated method such that it becomes possible in a simple and cost-effective manner to ascertain a voltage type of an input voltage and to determine in the most accurate way possible a voltage value of an input voltage of a power supply or a switched-mode power supply.

This and other objects and advantages are achieved in accordance with the invention by a circuit arrangement for ascertaining a voltage type and a voltage value, in particular an average value, of an input voltage. This circuit arrangement is arranged such that the input voltage of the power supply drops at an input side of the circuit arrangement. The circuit arrangement comprises at least a differential amplifier for converting the input voltage into a useful signal, which is rectified via a first rectifier unit. The first rectifier unit is arranged at an output of the differential amplifier and a first compensation diode is assigned thereto such that a forward voltage of the first rectifier unit is compensated. The circuit arrangement furthermore comprises an inverter that generates an inverted useful signal from the useful signal. The inverted useful signal is rectified via a second rectifier unit that is arranged at an output of the inverter, where a second compensation diode is assigned to the second rectifier unit such that a forward voltage of the second rectifier unit is compensated. The circuit arrangement furthermore comprises a mixer unit that generates a first output signal from the rectified useful signal and the rectified inverted useful signal. The circuit arrangement furthermore has on the output side a filter unit, such as an RC filter, for example, which generates a second output signal (for example, an average value of the rectified input voltage signal) from the first output signal of the circuit arrangement.

The main aspect of the solution proposed in accordance with the invention consists in making it possible to accurately analyze an input voltage of a power supply or a switched-mode power supply in a simple and cost-effective manner. That is, a voltage type (AC or DC voltage) and a voltage value, in particular an average value, of the input voltage are ascertained as accurately as possible. Here, a first output signal is generated, on the basis of which a voltage type of the input voltage (for example, DC voltage or AC voltage) can be ascertained. A second output signal, which can be used to accurately measure a voltage value, such as the average value, for example, of the input voltage, is derived from the first output signal. By installing the rectifier units, which can be configured, for example, as rectifier diodes, on the output side, it is possible to use cost-effective components, because it is possible to measure on the input side of the circuit arrangement in the case of a lower voltage level. with the compensation diodes assigned to the rectifier units, a relatively high forward voltage of the respective rectifier unit or the respective rectifier diode is compensated. As a result, very accurate measurement results (especially when ascertaining the voltage value or average value of the input voltage) can be achieved.

The filter unit of the circuit arrangement, such as an RC filter, for example, which is arranged on the output side, ideally generates a second output signal (for example, an average value of the rectified input voltage signal) from the first output signal of the circuit arrangement. In this way, the voltage type of the input voltage can be ascertained from the first output signal and a measurement value for the voltage or average value of the input voltage can be ascertained from the second output signal.

To this end, the first output signal and the second output signal can ideally be forwarded via a data connection (for, example process field network (Profinet)) to a control unit for evaluation. This control unit may be arranged, for example, locally or centrally and may be formed, for example, as a microcontroller.

It is also expedient if the differential amplifier is configured to have a high impedance on the input side. As a result, the relatively high voltage level of the input voltage (for example, 84 V to 278 V) in the useful signal generated can be reduced to a substantially lower voltage level (for example, 0.5 V to 12.5 V) in a simple manner. As a result, more cost-effective components, which are not designed for high voltages, can be used in particular for the rectifier units.

In a preferred embodiment of the circuit arrangement in accordance with the invention, the first rectifier unit and the assigned first compensation diode and the second rectifier unit and the assigned second compensation diode are each configured as double diodes. Here, the respective rectifier unit and the respective compensation diode are, for example, installed in a housing and ideally thermally coupled as a result. The thermal coupling makes it possible to eliminate temperature-dependent forward voltages very easily and to achieve a relatively accurate evaluation or measurement of the input voltage.

In an expedient embodiment of the invention, the differential amplifier and the inverter are configured such that an internal auxiliary supply of the power supply can be used as the operating voltage for the differential amplifier and the inverter. In this way, no additional voltage supply for the supply of the differential amplifier and the inverter is required. The circuit arrangement can thus be configured in a manner that saves space and costs. To this end, a reference voltage (for example, of 5 volts) is also provided, which is used as a reference voltage on the input side by the differential amplifier and the inverter. With the reference voltage, for example, an output voltage of the differential amplifier or the inverter is shifted by the corresponding value of the reference voltage. As a result, only the voltage source present and a reference or ground potential can be used for the voltage supply of the differential amplifier or the inverter. A negative voltage source for supplying the differential amplifier or the inverter can be dispensed with.

It is also an object of the invention to provide a method for ascertaining a voltage type of an input voltage of a power supply, for which a first output signal based on the input voltage of the power supply is used, where the first output signal is detected via the circuit arrangement in accordance with disclosed embodiments of the invention. To this end, after the first output signal has been detected using the circuit arrangement in accordance with the disclosed embodiments, after a peak of the first output signal is determined or passed through for the first time, the method waits until a first threshold value is undershot. The following steps are then run through until a predetermined number of repetitions is reached:

storing a time stamp and starting a predetermined dead time when the first output signal undershoots the first threshold value;

checking whether the first output signal exceeds a second threshold value after the predetermined dead time has elapsed; and waiting until the first output signal undershoots the first threshold value again when the first output signal has exceeded the second threshold value when the dead time has elapsed, wherein the second threshold value is greater than the first threshold value.

A frequency of the input voltage and thus the type of input voltage is derived from the stored time stamps after the predetermined number of repetitions has been reached.

The method in accordance with the invention can be used to ascertain the voltage type of the input voltage in a simple and robust manner. To this end, for example, a frequency of the input voltage is derived from at least two stored time stamps. For example, if a frequency in a range of from 45 to 65 Hertz can be determined, this is evaluated, for example, as a supply with an AC voltage. The method in accordance with the invention can ideally be used to identify the voltage type of the input voltage even in the case of interference in the network or supply voltage, such as during switch-on with a small isolating transformer, etc.

It is also expedient when the method in accordance with the invention is terminated when the second threshold value is not exceeded within a predeterminable first period after the dead time has elapsed or when the first threshold value is not undershot after a second predeterminable period has elapsed. Identical values or different values can be selected for the first period and for the second period, for example. The measurement or the steps of the method in accordance with the invention can be repeated, for example, until a valid AC voltage supply (for example, 10 times) has been detected. If no valid AC voltage has been determined after the number of predetermined repetitions or after the first or second period (for example, 100 ms) has elapsed, it is assumed that a DC voltage (for example, from a battery) as input voltage is used as supply voltage the power supply.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained below by way of example based on the appended figures, in which.

DETAILED DESCRIPTION OF THE EXEMPLARY EMBODIMENTS

Figure 1:
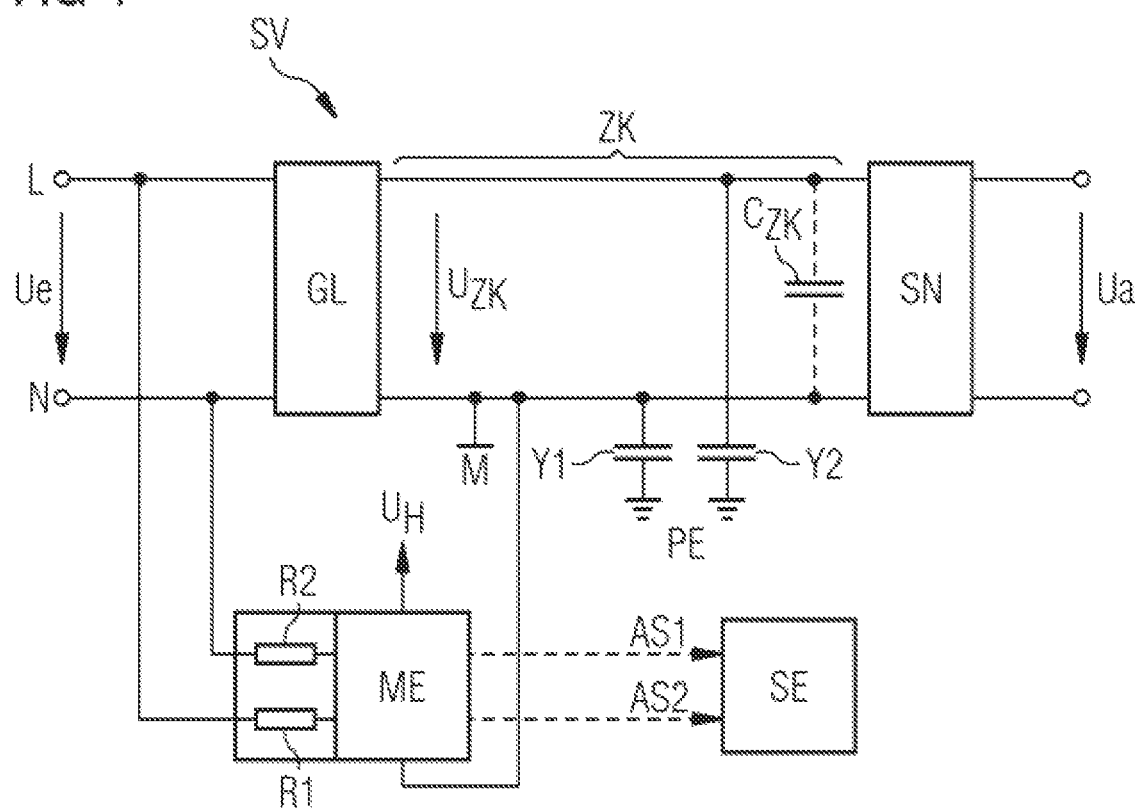
FIG. 1 shows an exemplary schematic illustration of a power supply having the circuit arrangement in accordance with the invention for ascertaining a voltage type and a voltage value of an input voltage.

FIG. 1 shows schematically and by way of example a single-phase power supply or a single-phase switched-mode power supply SV, which comprises the circuit arrangement ME in accordance with the invention for ascertaining a voltage type and a voltage value of an input voltage Ue of the power supply SV or of the switched-mode power supply SV. The exemplary power supply SV is supplied with the input voltage Ue by a supply network, where the input voltage Ue is formed, for example, by a voltage difference between a phase conductor L and the neutral conductor N of the supply network. That is, only one phase conductor L or one phase L of the supply network is used to supply voltage to the power supply SV.

The input voltage Ue, which may be, for example, a 230 V AC voltage, is converted via a rectifier unit GL as the input stage of the power supply SV to a rectified intermediate circuit voltage $U_{ZK}$ on an output side of the rectifier unit GL or an input side of an intermediate circuit ZK. The intermediate circuit voltage $U_{ZK}$ is, in this case, referred to as a reference potential M or a ground potential M. The intermediate circuit ZK may comprise, for example, an optional intermediate circuit capacitor $C_{ZK}$. Furthermore, at least two Y capacitors Y1, Y2 are connected in the intermediate circuit ZK, for example, for reasons of electromagnetic compatibility. The Y capacitors Y1, Y2 are arranged in the intermediate circuit ZK between the upper potential and between the reference or ground potential M and a protective ground conductor PE or the so-called protective earth PE.

The mostly unstabilized input voltage Ue is converted by the power supply SV or the switched-mode power supply SV into a constant output voltage Ua (for example, a DC voltage of 4 to 28 V) at an output side of the power supply SV or the switch-mode power supply SV to supply one or more consumers, where a constancy of the output voltage Ua is achieved through regulation of the flow of energy. To this end, the power supply SV furthermore comprises a switch converter SN, which is arranged on an output side of the intermediate circuit ZK. This switch converter SN has at least one periodically operating electronic switching element and can be formed, for example, as a potential-isolating switch converter SN, which has a DC isolation (for example, transformer), or as a potential-bound (i.e., non-potential-isolating) switching converter SN without DC isolation. The constant output voltage Ua can then be tapped on an output side of the switch converter SN or be provided to one or a plurality of consumers.

Furthermore, the power supply SV comprises the circuit arrangement ME in accordance with the invention, which can be used to determine a voltage type and a voltage value of the input voltage Ue of the power supply SV or the switched-mode power supply SV. Here, the circuit arrangement ME is arranged such that the input voltage Ue of the power supply SV drops at an input of the circuit arrangement ME. To this end, the circuit arrangement ME is connected, for example, on the input side via high-impedance resistors R1, R2 to the phase conductor L and to the neutral conductor N on the input side of the switched-mode power supply SV. An auxiliary voltage $U_H$ (for example, 13 V) is provided for a voltage supply of the circuit arrangement ME. For example, an auxiliary supply already used in the power supply SV, for example, for control and/or signal units can be used as auxiliary voltage $U_H$. The circuit arrangement is furthermore connected to the reference potential or ground potential M of the intermediate circuit ZK of the power supply SV.

Two output signals AS1, AS2 are provided on the output side by the circuit arrangement ME. These output signals AS1, AS2 can be forwarded, for example, via a data connection (for example, process field network or Profinet for short) to a local or central control unit SE. The output signals AS1, AS2 can be evaluated accordingly with the aid of the control unit SE, which may be formed, for example, as a microcontroller. The voltage type of the input voltage Ue can be derived from a first output signal AS1, for example, via the associated method for ascertaining a voltage type of the input voltage Ue of the power supply SV. That is, it is possible to determine from the first output signal AS1 (as is described in more detail below based on FIG. 4) whether the input voltage Ue is an AC voltage or DC voltage. A second output signal AS2 can be used for accurate determination of a voltage value or average value of the input voltage Ue.

Figure 2:
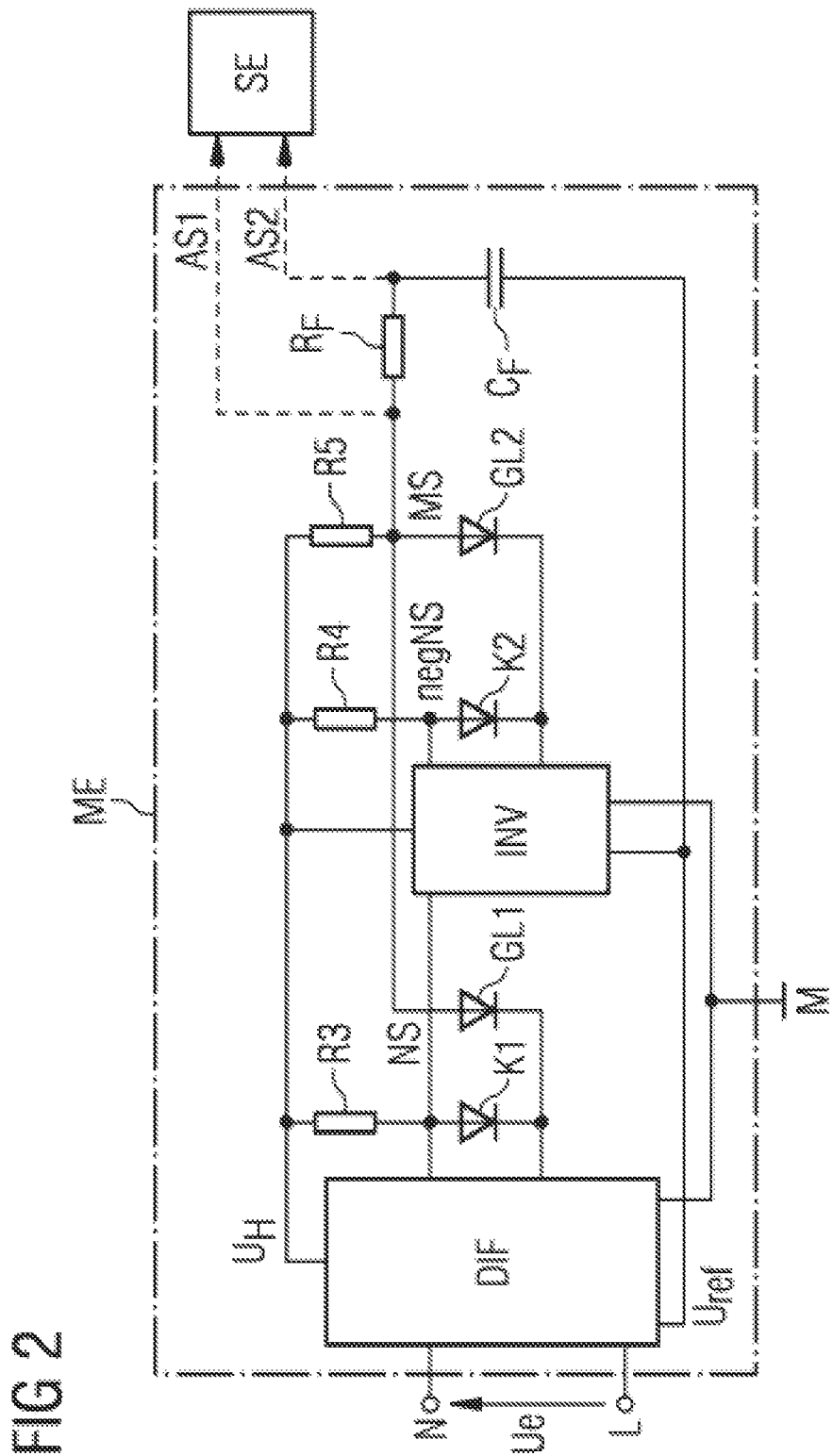
FIG. 2 shows a schematic illustration of an exemplary embodiment of the circuit arrangement in accordance with the invention.

FIG. 2 now schematically shows an exemplary embodiment of the circuit arrangement ME in accordance with the invention for ascertaining the voltage type and a voltage value of the input voltage Ue of the power supply SV, where the circuit arrangement is configured such that the input voltage Ue of the power supply SV is also applied to an input side of the circuit arrangement ME. To this end, the input side of the circuit arrangement is connected, for example, to the phase conductor L and to the neutral conductor N of the single-phase voltage supply of the power supply SV for the switched-mode power supply SV, where the differential voltage between the phase conductor L and the neutral conductor N is applied as input voltage Ue to the input of the circuit arrangement ME or of a differential amplifier DIF of the circuit arrangement ME. The input voltage Ue with a relatively high-voltage level (for example, 84 to 278 V) is converted by the differential amplifier DIF to a useful signal NS with a low voltage level (for example, 0.5 to 12.5 V). The differential amplifier DIF is configured to have a high impedance on the input side.

A first rectifier unit GL1, in particular a half-wave rectifier GL1 or a rectifier diode GL1, is installed on an output side of the differential amplifier DIF, where the rectifier unit rectifies the useful signal NS generated by the differential amplifier DIF and forwards the useful signal to a mixer unit MS. The first rectifier unit GL1 is assigned a first compensation diode K1, which compensates for a voltage shift caused by the forward direction of the first rectifier unit GL1. Ideally, the first rectifier unit GL1 and the first compensation diode K1 can be configured as a "double diode". That is, the two units GL1, K1 are installed, for example, in a joint housing and as a result are thermally coupled, as a result of which temperature-dependent forward voltages can be eliminated easily and well.

The compensation diode is furthermore assigned a first pull-up resistor R3, which connects a (signal) line to a higher voltage potential. The first pull-up resistor is arranged between an anode of the first compensation diode K1 and an auxiliary voltage $U_H$. The auxiliary voltage $U_H$ (for example, 13 V) which, for example, is already present in the power supply SV for the voltage supply of, for example, internal control and/or signal units, is also used for the voltage supply of the differential amplifier DIF or as operating voltage $U_H$ for the differential amplifier DIF. The differential amplifier DIF furthermore has a connection to a reference or ground potential M.

The circuit arrangement ME in accordance with the invention furthermore comprises an inverter INV, which likewise uses the internal auxiliary voltage $U_H$ for the voltage supply or as operating voltage and also has a connection to the reference or ground potential M. The useful signal NS generated by the differential amplifier DIF is converted to an inverted useful signal negNS by the inverter INV.

A second rectifier unit GL2, in particular a half-wave rectifier GL2 or a rectifier diode GL2, is installed on an output side of the inverter INV, where the rectifier unit rectifies the inverted useful signal negNS generated by the inverter INV and forwards the inverted useful signal to the mixer unit MS. The second rectifier unit GL2 is likewise assigned a second compensation diode K2, which compensates for a voltage shift caused by the forward direction of the second rectifier unit GL2. Ideally, the second rectifier unit GL2 and the second compensation diode K2 are also configured as a "double diode". The second rectifier unit GL2 and the second compensation diode K2 are likewise installed in a joint housing and as a result are thermally coupled, as a result of which temperature-dependent forward voltages can be eliminated easily and well.

The second compensation diode K2 and the second rectifier unit GL2 are each assigned a second and a third pull-up resistor R4, R5. The second pull-up resistor R4 is arranged between the anode of the second compensation diode K2 and the auxiliary supply $U_H$. The third pull-up resistor R5 is installed between the anode of the second rectifier unit GL2 and the auxiliary supply $U_H$.

In order, for example, to save a negative operating voltage $-U_H$ for the differential amplifier DIF or for the inverter INV or to be able to use the internal auxiliary supply $U_H$ of the power supply SV, a reference voltage Uref (for example, 5 V) is also provided.

The useful signal NS of the differential amplifier DIF and the inverted useful signal negNS of the inverter INV are then combined in the mixer unit MS to form a first output signal AS1, which is used, for example, to determine the voltage type of the input voltage Ue. That is, it is possible to derive from the first output signal AS1 whether the input voltage Ue as an AC or DC voltage.

The circuit arrangement ME furthermore has a filter unit. The filter unit is configured, for example, as an RC filter and comprises a resistor $R_F$ and a capacitance $C_F$. With the aid of the filter unit, a second output signal AS2, which represents, for example, an average value of the first output signal AS1, can be generated from the first output signal AS1. The second output signal AS2 can be used, for example, to determine the input voltage Ue or an input voltage average value relatively accurately.

The first output signal AS1, like the second output signal AS2, can then be forwarded, for example, via a data connection (Profinet, etc.) to a local or central control unit SE, via which the output signals AS1, AS2 can be evaluated accordingly.

Figure 3:
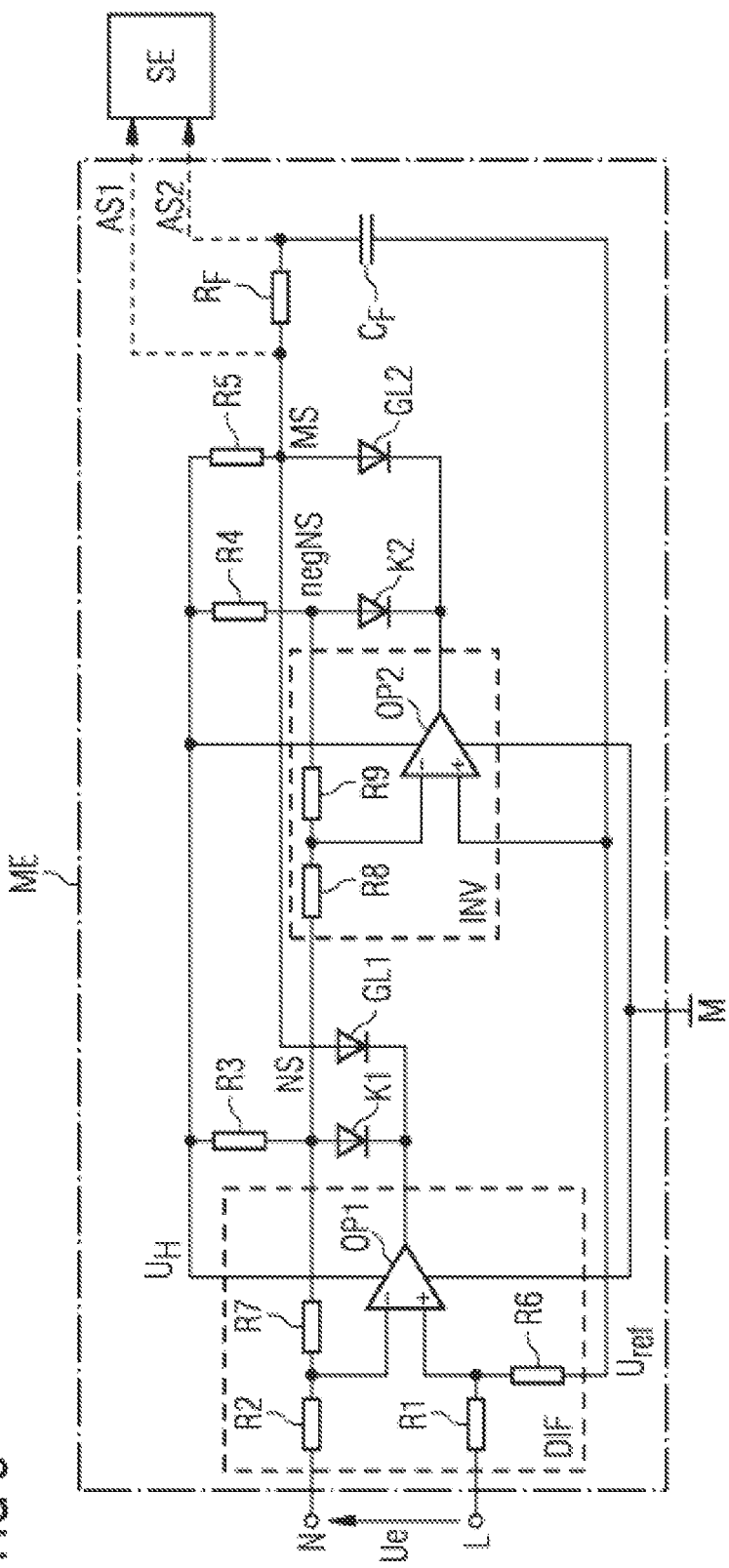
FIG. 3 shows an exemplary detailed illustration of the circuit arrangement in accordance with the invention.

FIG. 3 likewise schematically illustrates by way of example the circuit arrangement ME in accordance with the invention for ascertaining a voltage type and a voltage value of the input voltage Ue of the voltage supply SV, where especially exemplary embodiments of the differential amplifier DIF and inverter INV can be seen in FIG. 3.

The differential amplifier DIF of the circuit arrangement ME may be configured, for example, as an operational amplifier circuit. To this end, the differential amplifier DIF comprises an operational amplifier OP1, which uses, for example, the auxiliary voltage $U_H$ as positive operating voltage and the negative operating voltage connection of which is connected to the reference or ground potential M. The differential amplifier DIF furthermore comprises on the input side two input resistors R1, R2, which are formed so as to have a high impedance and, for example, have an equal resistance value. Two further resistors R6, R7 are also provided, which are formed so as to have a low impedance in comparison with the input resistors R1, R2 and, for example, likewise can have the same resistance value. Here, the first resistor R6 of the differential amplifier DIF is connected to the reference voltage Uref and the second resistor R7 is arranged in the feedback system of the differential amplifier DIF. The first rectifier unit GL1 is again arranged on the output side of the differential amplifier DIF or the operational amplifier OP1 of the differential amplifier DIF and the first compensation diode K1 is arranged in the feedback system of the differential amplifier circuit DIF.

As FIG. 3 illustrates by way of example, the inverter INV can also be configured as an operational amplifier circuit having an operational amplifier OP2. The operational amplifier OP2 also uses, for example, the auxiliary voltage $U_H$ as positive operating voltage and its negative operating voltage connection is connected to the reference or ground potential M. A positive input of the operational amplifier OP2 of the inverter INV is connected, for example, to the reference voltage Uref. The useful signal NS generated by the differential amplifier DIF is fed to a negative input of the operational amplifier OP2 of the inverter INV via a first resistor R8 of the inverter INV. A second resistor R9 of the inverter INV is installed in the feedback system of the operational amplifier OP2 of the inverter INV, where the two resistors R8, R9 of the inverter INV have the same resistance value for inverting the useful signal NS. The second rectifier unit GL2 for rectifying the inverted useful signal negNS is arranged on the output side of the inverter INV or the operational amplifier OP2 and the second compensation diode is arranged in the feedback system of the inverter circuit INV.

The rectified useful signal NS from the differential amplifier DIF and the rectified inverted useful signal negNS are again fed to the mixer unit MS and mixed to form the first output signal AS1. The second output signal AS2 is then derived from the first output signal AS1 via the RC filter unit $R_F$, $C_F$.

Figure 4:
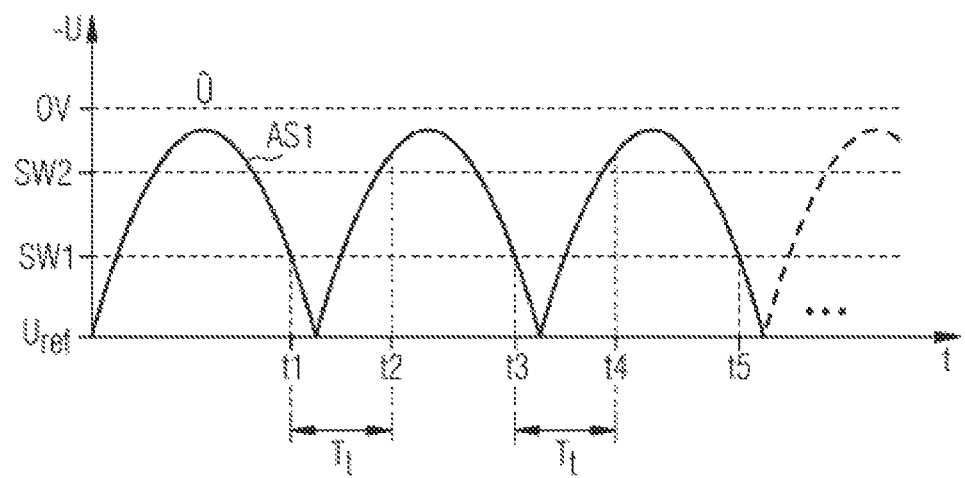
FIG. 4 shows graphical plot of an exemplary profile of a first output signal, generated by the circuit arrangement in accordance with the invention, with a corresponding derivation of the voltage type of the input voltage.

FIG. 4 shows by way of example a graphical plot of a time profile of a first output signal AS1, generated by the circuit arrangement ME in accordance with the invention, from which a voltage type of the input voltage Ue is derived in accordance with the method in accordance with the invention.

Here, a time t is plotted on a horizontal axis and a voltage −U is plotted on a vertical axis. An intersection of the vertical axis with the horizontal axis is also at a voltage value of the reference voltage Uref (for example at 5 V). Dashed marks for 0 volts, for a first threshold value SW1 and a second threshold value SW2 are also plotted on the vertical axis, where the first threshold value SW1 is closer to the value of the reference voltage Uref than the second threshold value SW2. As an alternative, a threshold value with a hysteresis can also be used. On account of the rectification by the two rectifier units GL1, GL2 of the circuit arrangement ME, the first output signal AS1 has, for example, a time profile of a pulsed DC voltage, where a wave has a peak Û.

For the evaluation of the input voltage Ue or the first output signal AS1, after the method in accordance with the invention has begun, there is first a wait for the peak Û of the first output signal to be passed through for the first time. Coming from the peak Û, there is then a wait for the first threshold value SW1 to be undershot. If it is determined that the first threshold value SW1 has been undershot, for example, at a first time t1, then a first time stamp is stored and a predetermined dead time $T_t$ is started. After the predetermined dead time $T_t$ has elapsed, there is at a second time t2 a check to determine whether the second threshold value SW2 has been exceeded or a wait until this has happened. After the second threshold value SW2 has been exceeded, there is a wait until the first output signal AS1 undershoots the first threshold value SW1 again. If the first threshold value SW1 is undershot again at a third time t3, a second time stamp is stored again and the predetermined dead time $T_t$ is then started. After the dead time $T_t$ has elapsed, there is another check at a fourth time t4 to determine whether the second threshold value SW2 has been exceeded. If this is the case, then there is another wait for the undershooting of the first threshold value SW1 and a time stamp is stored when the undershooting of the first threshold value SW1 is determined by the first output signal AS1 at a fifth time t5.

The steps of "storing a time stamp and starting a predetermined dead time $T_t$ when the first output signal AS1 undershoots the first threshold value SW1", "checking whether the first output signal AS1 exceeds a second threshold value SW2 after the predetermined dead time $T_t$ has elapsed" and "waiting until the first output signal AS1 undershoots the first threshold value again after the first output signal AS1 has exceeded the second threshold value SW2 when the dead time $T_t$ has elapsed" are repeated until a predetermined number of repetitions, for example, 10 repetitions, has been reached. A frequency of the first output signal AS1 and thus of the input voltage Ue can then be derived from at least two stored time stamps. If this frequency is, for example, in a range of from 45 to 65 Hertz, then the input voltage Ue can be evaluated as an AC voltage.

If, after the dead time $T_t$ has elapsed, the second threshold value SW2 is never exceeded within a predeterminable first period (for example 100 ms) or if, after a second period has elapsed, for example after the peak Û of the first output signal AS1 has been passed through for the first time, the first threshold value SW1 is never undershot, then performance of the method can be terminated or the input voltage Ue can be evaluated as a DC voltage. The input voltage Ue can also be evaluated as a DC voltage when it is not possible to detect a frequency of the first output signal AS1 from the stored time stamps, for example, after the predetermined number of repetitions of the method step. The method for ascertaining a voltage type of an input voltage Ue of a power supply SV can be performed, for example, in the control unit SE. The evaluation of the first and the second output signal AS1, AS2 can then be forwarded, for example, to a local or central control, evaluation and/or display unit, in order, for example, to be displayed or to be further processed accordingly.

Figure 5:
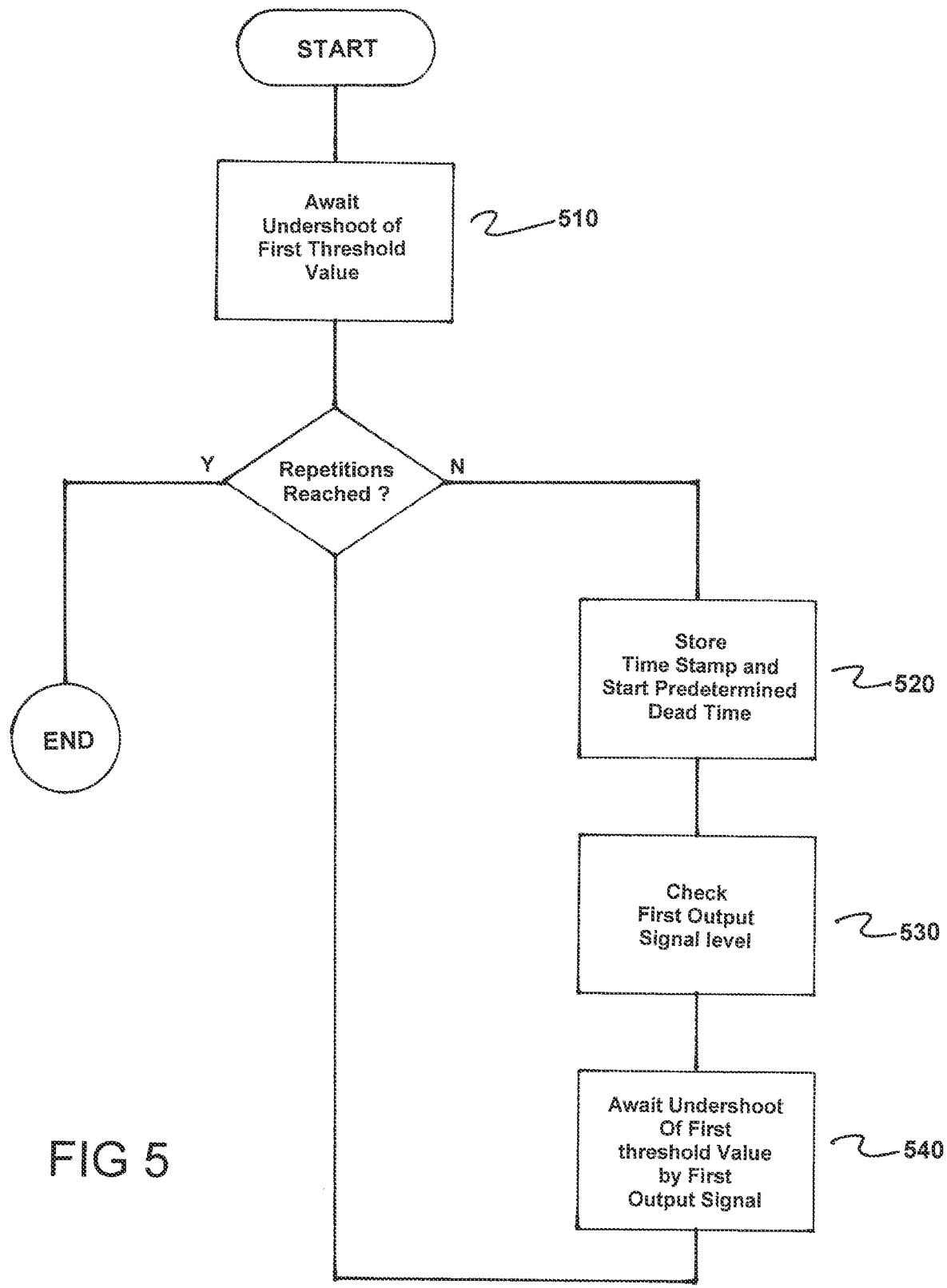
FIG. 5 is a flowchart of the method in accordance with the invention.

FIG. 5 is a flowchart of the method for ascertaining a voltage type of an input voltage Ue of a power supply, where a first output signal AS1 based on the input voltage Ue of the power supply SV is detected utilizing the circuit arrangement ME in accordance with the disclosed embodiments.

The method comprises awaiting a first threshold value SW1 to be undershot after a peak Û of the first output signal AS1 is passed through for a first time, as indicated in step 510.

Next, until a predetermined number of repetitions is reached, the method further comprises storing a time stamp and starting a predetermined dead time Tt when the first output signal AS1 undershoots the first threshold value SW1 (step 520), checking whether the first output signal AS1 exceeds a second threshold value SW2 after the predetermined dead time Tt has elapsed (step 530) and waiting until the first output signal AS1 undershoots the first threshold value again when the first output signal AS1 has exceeded the second threshold value SW2 when the dead time Tt has elapsed, as indicated in step 540.

In accordance with the method of the invention, the second threshold value SW2 is greater than the first threshold value SW1, where the frequency of the input voltage Ue is derived from the stored time stamps after the predetermined number of repetitions has been reached.

Thus, while there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for ascertaining a voltage type of an input voltage of a power supply, a first output signal based on the input voltage of the power supply being detected utilizing a circuit arrangement, the method comprising:

awaiting a first threshold value to be undershot after a peak of the first output signal is passed through for a first time, until a predetermined number of repetitions is reached, the method further comprising:

storing a time stamp and starting a predetermined dead time when the first output signal undershoots the first threshold value;

checking whether the first output signal exceeds a second threshold value after the predetermined dead time has elapsed; and waiting until the first output signal undershoots the first threshold value again when the first output signal has exceeded the second threshold value when the dead time has elapsed, the second threshold value being greater than the first threshold value;

wherein a frequency of the input voltage is derived from the stored time stamps after the predetermined number of repetitions has been reached.

2. The method as claimed in claim 1, wherein the method is terminated when the second threshold value is not exceeded within a predeterminable first period after the dead time has elapsed.

3. The method as claimed in claim 1, wherein the method is terminated when the first threshold value is not undershot after a second predeterminable period has elapsed.

* * * * *